US008228093B2

(12) United States Patent
Chiba et al.

(10) Patent No.: US 8,228,093 B2
(45) Date of Patent: Jul. 24, 2012

(54) DATA COMMUNICATION CIRCUIT, TRANSMISSION APPARATUS, RECEPTION APPARATUS, AND TRANSMISSION/RECEPTION SYSTEM

(75) Inventors: Tomoko Chiba, Osaka (JP); Hirokazu Sugimoto, Osaka (JP); Toru Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/963,998

(22) Filed: Dec. 9, 2010

(65) Prior Publication Data
US 2011/0074465 A1   Mar. 31, 2011

Related U.S. Application Data

(63) Continuation of application No. PCT/JP2010/001378, filed on Mar. 1, 2010.

(30) Foreign Application Priority Data

Jul. 9, 2009   (JP) .................................. 2009-162871

(51) Int. Cl.
*H03K 19/0175* (2006.01)
(52) U.S. Cl. ............... 326/86; 326/83; 326/30; 326/115; 327/108; 327/112

(58) Field of Classification Search .................... 326/83, 326/81, 86, 30, 115, 121, 127; 327/108–112
See application file for complete search history.

(56) References Cited

U.S. PATENT DOCUMENTS

| | | | | |
|---|---|---|---|---|
| 4,906,867 | A * | 3/1990 | Petty | 326/27 |
| 6,411,146 | B1 * | 6/2002 | Kuo | 327/198 |
| 6,958,623 | B2 * | 10/2005 | Congdon | 326/24 |
| 7,088,163 | B1 * | 8/2006 | Bell et al. | 327/271 |
| 7,164,292 | B2 * | 1/2007 | Schmitt et al. | 326/86 |
| 7,456,649 | B2 * | 11/2008 | Miyazaki | 326/27 |
| 7,593,470 | B2 * | 9/2009 | Segaram | 375/257 |
| 7,750,666 | B2 * | 7/2010 | Zhang et al. | 326/30 |
| 7,835,453 | B2 * | 11/2010 | Haridass et al. | 375/257 |
| 7,969,195 | B1 * | 6/2011 | Fortin et al. | 326/83 |
| 2004/0013003 | A1 * | 1/2004 | Huber | 365/189.05 |
| 2007/0247192 | A1 * | 10/2007 | Miyazaki | 326/83 |

FOREIGN PATENT DOCUMENTS

JP   05-218312   8/1993

* cited by examiner

*Primary Examiner* — Vibol Tan
(74) *Attorney, Agent, or Firm* — McDermott Will & Emery LLP

(57) ABSTRACT

A driver supplies data signal via a supply node. A voltage-relaxing transistor has a source connected to the supply node of the driver, a drain connected to a signal node connected to a signal line, and a gate to which the voltage at the signal node is applied.

16 Claims, 9 Drawing Sheets

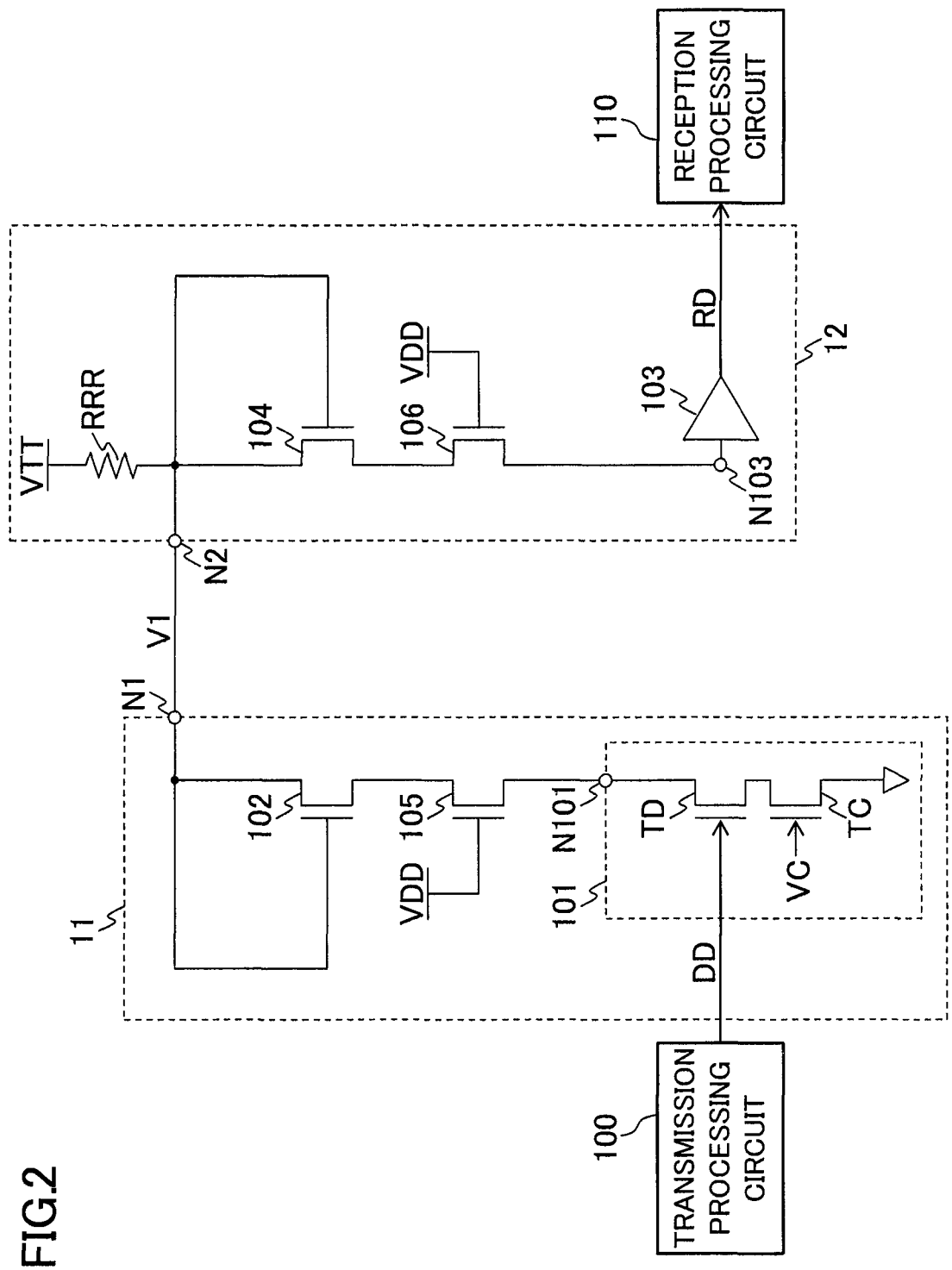

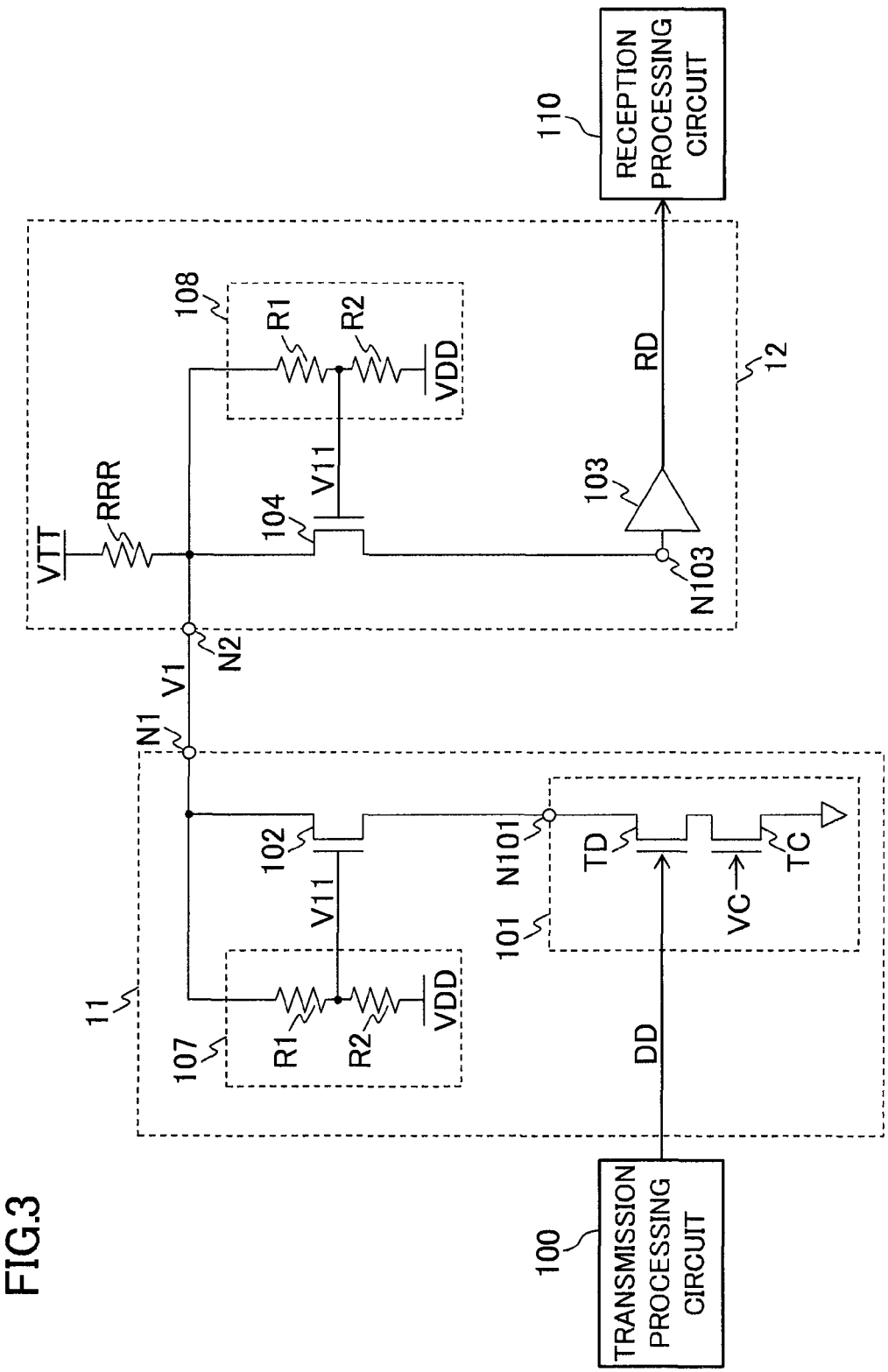

DATA COMMUNICATION CIRCUIT, TRANSMISSION APPARATUS, RECEPTION APPARATUS, AND TRANSMISSION/RECEPTION SYSTEM

CROSS-REFERENCE TO RELATED APPLICATION

This is a continuation of PCT International Application PCT/JP2010/001378 filed on Mar. 1, 2010, which claims priority to Japanese Patent Application No. 2009-162871 filed on Jul. 9, 2009. The disclosures of these applications including the specifications, the drawings, and the claims are hereby incorporated by reference in their entirety.

BACKGROUND

The present disclosure relates to data communication circuits that transmit or receive a signal via a signal line, and more particularly to a technique of preventing breakdown of data communication circuits.

In recent years, with increase in the level of integration of data communication circuits, the breakdown voltage of the data communication circuits is becoming lower and lower. For this reason, protection of the data communication circuits from breakdown is being increasingly requested. Japanese Patent Publication No. H05-218312 (Patent Document 1) discloses an open-drain output circuit constructed of first and second nMOS transistors. The source electrode of the first nMOS transistor is connected to a ground node, and a signal from a drive circuit is applied to the gate electrode of the first nMOS transistor. The source electrode of the second nMOS transistor is connected to the drain electrode of the first nMOS transistor, the drain electrode thereof is connected to an output terminal (one terminal of a current path), and the gate electrode thereof is connected to a power supply terminal. Having such a configuration, the first and second nMOS transistors can be protected from breakdown even if a voltage higher than the power supply voltage is applied to the output terminal.

SUMMARY

The circuit of Patent Document 1 has a problem as follows. When no power supply voltage is applied to the gate of the second nMOS transistor, an inter-terminal voltage (in particular, a gate-drain voltage and a source-drain voltage) of the second nMOS transistor becomes equal to the voltage at the output terminal. Therefore, an inter-terminal voltage of the second nMOS transistor may possibly exceed the breakdown voltage of the second nMOS transistor, resulting in breakdown of the second nMOS transistor. As such, it is difficult to prevent breakdown of the data communication circuit (in particular, the second nMOS transistor).

It is an objective of the present disclosure to provide a data communication circuit in which a voltage-relaxing transistor can be prevented from breakdown.

According to one aspect of the present invention, a data communication circuit is a circuit configured to transmit a data signal pair including first and second data signals changing complementarily to each other via a signal line pair, including: a driver configured to supply the data signal pair via a supply node pair including first and second supply nodes; a first voltage-relaxing transistor having a source connected to the first supply node of the driver, a drain connected to a first signal node connected to one signal line of the signal line pair, and a gate to which a voltage at a second signal node connected to the other signal line of the signal line pair is applied; and a second voltage-relaxing transistor having a source connected to the second supply node of the driver, a drain connected to the second signal node, and a gate to which a voltage at the first signal node is applied. With this configuration, since the voltages at the first and second supply nodes can be relaxed by the first and second voltage-relaxing transistors, the driver can be prevented from breakdown. Also, since the inter-terminal voltages of the first and second voltage-relaxing transistors can be made lower than those in the conventional case, the first and second voltage-relaxing transistors can also be prevented from breakdown.

The data communication circuit may further include: a first auxiliary transistor interposed between the first supply node of the driver and the source of the first voltage-relaxing transistor, the first auxiliary transistor having a source connected to the first supply node of the driver, a drain connected to the source of the first voltage-relaxing transistor, and a gate to which a first bias voltage is applied; and a second auxiliary transistor interposed between the second supply node of the driver and the source of the second voltage-relaxing transistor, the second auxiliary transistor having a source connected to the second supply node of the driver, a drain connected to the source of the second voltage-relaxing transistor, and a gate to which a second bias voltage is applied. With this configuration, the driver can be prevented from breakdown. Also, with the voltage relaxing effect of the first and second voltage-relaxing transistors, the first and second auxiliary transistors can be prevented from breakdown.

The data communication circuit may further include a voltage adjustment section interposed between the drains and gates of the first and second voltage-relaxing transistors, the voltage adjustment section supplying a control voltage corresponding to an intermediate voltage between voltages at the first and second signal nodes to the gates of the first and second voltage-relaxing transistors. This configuration allows arbitrary setting of the voltage relaxing effect of the first and second voltage-relaxing transistors.

The threshold voltage of the first voltage-relaxing transistor may be equal to or more than a maximum voltage difference between a breakdown voltage of an element connected to the source of the first voltage-relaxing transistor and a gate voltage of the first voltage-relaxing transistor, and the threshold voltage of the second voltage-relaxing transistor may be equal to or more than a maximum voltage difference between a breakdown voltage of an element connected to the source of the second voltage-relaxing transistor and a gate voltage of the second voltage-relaxing transistor. This configuration ensures prevention of breakdown of an element connected to the sources of the first and second voltage-relaxing transistors.

According to another aspect of the present invention, a data communication circuit is a circuit configured to transmit a plurality of data signal pairs, each including first and second data signals changing complementarily to each other, via a plurality of signal line pairs, including: a plurality of drivers each configured to supply the data signal pair via a supply node pair including first and second supply nodes; a plurality of first voltage-relaxing transistors corresponding to the plurality of signal line pairs and the plurality of drivers, each of the first voltage-relaxing transistors having a source connected to the first supply node of the corresponding driver and a drain connected to a first signal node connected to one signal line of the corresponding signal line pair; a plurality of second voltage-relaxing transistors corresponding to the plurality of signal line pairs and the plurality of drivers, each of the second voltage-relaxing transistors having a source connected to the second supply node of the corresponding driver and a drain connected to a second signal node connected to the other signal line of the corresponding signal line pair; and a voltage adjustment section configured to supply a control voltage corresponding to an intermediate voltage between voltages at the first and second signal nodes connected to any one signal line pair out of the plurality of signal line pairs to gates of the plurality of first voltage-relaxing transistors and the plurality of second voltage-relaxing transistors. With this configuration, variations in the response speed of the first and second voltage-relaxing transistors caused by characteristic variations of the voltage adjustment section can be reduced, compared with the case of providing the voltage adjustment section individually for each signal line pair.

According to yet another aspect of the present invention, a data communication circuit is a circuit configured to transmit a data signal via a signal line, including: a driver configured to supply the data signal via a supply node; and a voltage-relaxing transistor having a source connected to the supply node of the driver, a drain connected to a signal node connected to the signal line, and a gate to which a voltage at the signal node is applied. With this configuration, the driver can be prevented from breakdown, and also the voltage-relaxing transistor can be prevented from breakdown.

According to yet another aspect of the present invention, a data communication circuit is a circuit configured to receive a data signal via a signal line, including: a receiver configured to receive the data signal via an input node; a voltage-relaxing transistor having a source connected to the input node of the receiver, a drain connected to a signal node connected to the signal line, and a gate to which a voltage at the signal node is applied; and a termination resistance connected to the signal node. With this configuration, the receiver can be prevented from breakdown, and also the voltage-relaxing transistor can be prevented from breakdown.

BRIEF DESCRIPTION OF THE DRAWINGS

FIG. 2 is a view illustrating the first variation of the transmission/reception system of FIG. 1.

FIG. 3 is a view illustrating the second variation of the transmission/reception system of FIG. 1.

DETAILED DESCRIPTION

Figure 1:
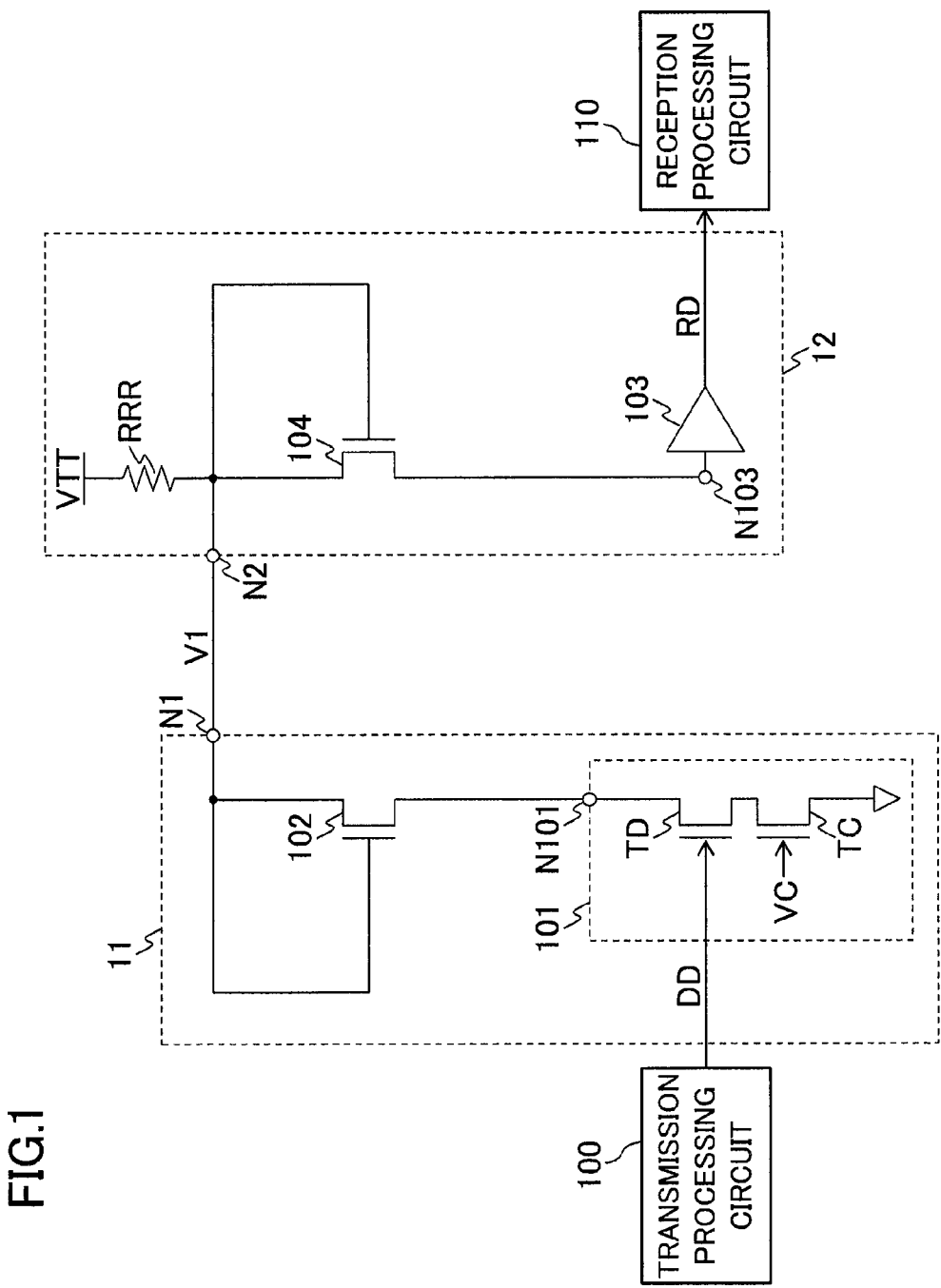
FIG. 1 is a view showing a configuration of a transmission/reception system of the first embodiment.

Embodiments of the present invention will be described in detail with reference to the accompanying drawings. It should be noted that the same or corresponding portions are denoted by the same reference characters throughout the drawings, and repeated description of such portions is avoided.

First Embodiment

FIG. 1 shows a configuration of a transmission/reception system of the first embodiment. This transmission/reception system includes: a transmission apparatus including a transmission processing circuit 100 and a data communication circuit 11; and a reception apparatus including a data transmission circuit 12 and a reception processing circuit 110. The data communication circuit 11 includes a driver 101 and a voltage-relaxing transistor 102. The data communication circuit 12 includes a receiver 103, a voltage-relaxing transistor 104, and a termination resistance RRR. A signal node N1 of the data communication circuit 11 and a signal node N2 of the data communication circuit 12 are connected to a signal line, and the termination resistance RRR is connected between a power supply node receiving a termination power supply voltage VTT and the signal node N2.

The transmission processing circuit 100 supplies transmission data DD. The driver 101 converts the transmission data DD to a data signal and supplies the data signal via a supply node N101. The driver 101 includes a current source transistor TC and a drive transistor TD, for example. A predetermined voltage VC is applied to the gate of the current source transistor TC to allow the current source transistor TC to generate a predetermined current. The drive transistor TD is switched on/off according to the transmission data DD. For example, when the level of the transmission data DD is high, the drive transistor TD is in the on state. In this state, a predetermined current is drawn from the termination resistance RRR to a ground node via the signal nodes N2 and N1, the voltage-relaxing transistor 102, and the driver 101, causing a voltage drop at the termination resistance RRR. Assuming that the voltage drop at the termination resistance RRR is "Vα," for example, a signal voltage V1 (the voltage of the signal line) will be "VTT-Vα." Conversely, when the level of the transmission data DD is low, the drive transistor TD is in the off state. In this state, with no occurrence of a voltage drop at the termination resistance RRR, the signal voltage V1 will be "VTT." The transition of the signal voltage V1 is conveyed to the receiver 103 via the voltage-relaxing transistor 104. In this way, the receiver 103 receives the data signal transmitted from the data communication circuit 11 via an input node N103. The receiver 103 converts the data signal to reception data RD and supplies the data to the reception processing circuit 110. The reception processing circuit 110 processes the reception data RD.

The voltage-relaxing transistor 102 has a source connected to the supply node N101 of the driver 101, a drain connected to the signal node N1, and a gate to which the voltage at the signal node N1 (the signal voltage V1) is applied. The voltage-relaxing transistor 104 has a source connected to the input node N103 of the receiver 103, a drain connected to the signal node N2, and a gate to which the voltage at the signal node N2 (the signal voltage V1) is applied.

(Voltage Relaxation)

Voltage relaxation by the voltage-relaxing transistors 102 and 104 shown in FIG. 1 will be described. Assume herein that the threshold voltage of the voltage-relaxing transistors 102 and 104 is "Vth," for simplicity of description.

When the signal voltage V1 is "VTT," the voltage at the supply node N101 (the source voltage of the voltage-relaxing transistor 102) is "VTT-Vth." In this manner, the voltage at the supply node N101 can be made lower than "VTT" (the maximum of the signal voltage V1). In this case, also, with the drain and gate voltages of the voltage-relaxing transistor 102 being "VTT," the inter-terminal voltages (gate-drain voltage, gate-source voltage, and source-drain voltage) of the voltage-relaxing transistor 102 can be made lower than "VTT." Likewise, the voltage at the input node N103 (the source voltage of the voltage-relaxing transistor 104) can be made lower than "VTT," and also the inter-terminal voltages of the voltage-relaxing transistor 104 can be made lower than "VTT."

As described above, since the voltage at the supply node N101 can be relaxed by the voltage-relaxing transistor 102, the driver 101 can be prevented from breakdown. Moreover, since the inter-terminal voltages of the voltage-relaxing transistor 102 can be made lower than the signal voltage V1 (voltage of the signal line), the voltage-relaxing transistor 102 can also be prevented from breakdown. For example, the inter-terminal voltages of the voltage-relaxing transistor 102 can be made lower than the breakdown voltage of the voltage-relaxing transistor 102. Likewise, the receiver 103 can be prevented from breakdown with the existence of the voltage-relaxing transistor 104, and also the voltage-relaxing transistor 104 can be prevented from breakdown.

(Threshold Voltage of Voltage-Relaxing Transistor)

It is preferred that the threshold voltage of the voltage-relaxing transistor 102 is equal to or more than the maximum voltage difference between the breakdown voltage of an element connected to the source of the voltage-relaxing transistor 102 and the gate voltage of the voltage-relaxing transistor 102. For example, in the configuration of FIG. 1, when the breakdown voltage of the driver 101 is "2.5 V" and the termination power supply voltage VTT is "3.3 V," the threshold voltage of the voltage-relaxing transistor 102 should preferably be "0.8 V" or more. By this setting, the element connected to the source of the voltage-relaxing transistor 102 (the driver 101 in FIG. 1) can be prevented from breakdown. This also applies to the threshold voltage of the voltage-relaxing transistor 104.

First Variation of First Embodiment

As shown in FIG. 2, the data communication circuit 11 may be further provided with an auxiliary transistor 105. The auxiliary transistor 105, interposed between the supply node N101 of the driver 101 and the source of the voltage-relaxing transistor 102, has a source connected to the supply node N101 of the driver 101, a drain connected to the source of the voltage-relaxing transistor 102, and a gate to which a predetermined bias voltage (power supply voltage VDD in the illustrated example) is applied. With this configuration, the voltage at the supply node N101 can be limited to a value not exceeding the gate voltage of the auxiliary transistor 105. For example, when the breakdown voltage of the driver 101 is "2.5 V," a power supply voltage VDD of "2.5 V" may be applied to the gate of the auxiliary transistor 105. This ensures prevention of breakdown of the driver 101.

Moreover, since the drain voltage of the auxiliary transistor 105 is relaxed by the voltage-relaxing transistor 102 (i.e., the drain voltage of the auxiliary transistor 105 becomes lower than "VTT"), the inter-terminal voltages of the auxiliary transistor 105 can be lowered to below "VTT" even when no power supply voltage VDD is applied (when VDD is "0 V"). For example, the gate-drain voltage of the auxiliary transistor 105 will be "VTT-Vth" that is lower than "VTT," and hence the auxiliary transistor 105 can be prevented from breakdown. For example, the inter-terminal voltages of the auxiliary transistor 105 can be made lower than the breakdown voltage of the auxiliary transistor 105.

Similarly, the data communication circuit 12 may be further provided with an auxiliary transistor 106. The auxiliary transistor 106, interposed between the input node N103 of the receiver 103 and the source of the voltage-relaxing transistor 104, has a source connected to the input node N103 of the receiver 103, a drain connected to the source of the voltage-relaxing transistor 104, and a gate to which a predetermined bias voltage (power supply voltage VDD in the illustrated example) is applied. With this configuration, since a limit can be placed on the voltage at the input node N103 not to exceed the gate voltage of the auxiliary transistor 106, prevention of breakdown of the receiver 103 is ensured. Also, with the voltage relaxing effect of the voltage-relaxing transistor 104, the auxiliary transistor 106 can be prevented from breakdown.

Second Variation of First Embodiment

As shown in FIG. 3, the data communication circuit 11 may be further provided with a voltage adjustment section 107. The voltage adjustment section 107, interposed between the drain and gate of the voltage-relaxing transistor 102, generates a control voltage V11 (voltage lower than the signal voltage V1 in the illustrated example) based on the voltage at the signal node N1 and applies the generated voltage to the gate of the voltage-relaxing transistor 102. The voltage adjustment section 107 is constructed of resistances R1 and R2 connected in series between the signal node N1 and a power supply node receiving the power supply voltage VDD, for example. With this configuration, since the control voltage V11 can be adjusted by the voltage adjustment section 107, the voltage relaxing effect of the voltage-relaxing transistor 102 can be set arbitrarily. For example, as the control voltage V11 is lower, the source voltage of the voltage-relaxing transistor 102 can be made lower, improving the voltage relaxing effect of the voltage-relaxing transistor 102. Also, with the configuration shown in FIG. 3, in which the gate of the voltage-relaxing transistor 102 is connected to the signal node N1 via the resistance R1, it is possible to reduce generation of noise due to a gate capacitance of the voltage-relaxing transistor 102.

Figure 4A:
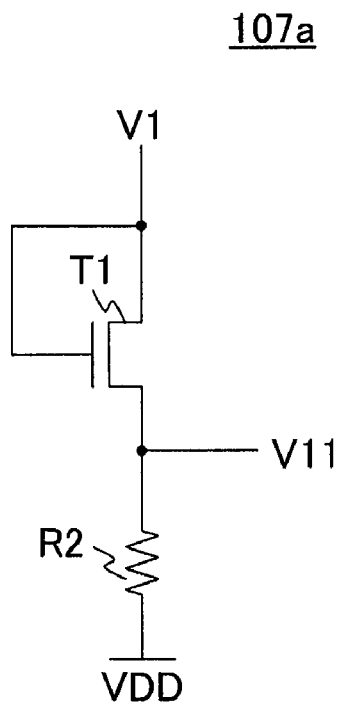
FIG. 4 is a view illustrating variations of a voltage adjustment section shown in FIG. 3.
Figure 4B:
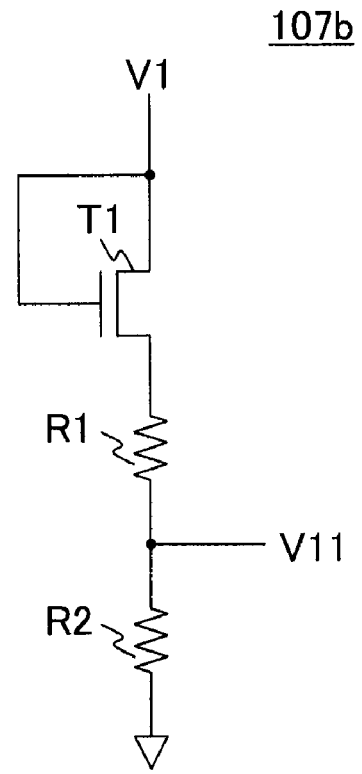

The data communication circuit 11 shown in FIG. 3 may be further provided with the auxiliary transistor 105 shown in FIG. 2. Also, the data communication circuit 11 shown in FIG. 3 may be provided with a voltage adjustment section 107a shown in FIG. 4A or a voltage adjustment section 107b shown in FIG. 4B, in place of the voltage adjustment section 107. The voltage adjustment section 107a shown in FIG. 4A includes an nMOS transistor T1 and the resistance R2 connected in series between the signal node N1 and a power supply node receiving the power supply voltage VDD. In this way, the control voltage V11 may be generated using the on resistance of the nMOS transistor T1. The voltage adjustment section 107b shown in FIG. 4B includes an nMOS transistor T1 and the resistances R1 and R2 connected in series between the signal node N1 and a ground node. In this way, the control voltage V11 may be generated by subjecting the signal voltage V1 and the power supply voltage VDD to resistance division. Alternatively, the control voltage V11 may be generated by subjecting the signal voltage V1 and the ground voltage to resistance division.

Similarly, the data communication circuit 12 may be further provided with a voltage adjustment section 108. With this configuration, the voltage relaxing effect of the voltage-relaxing transistor 104 can be set arbitrarily. The data communication circuit 12 shown in FIG. 3 may be further provided with the auxiliary transistor 106 shown in FIG. 2. Also, the data communication circuit 12 shown in FIG. 3 may be provided with a voltage adjustment section 107a shown in FIG. 4A or a voltage adjustment section 107b shown in FIG. 4B, in place of the voltage adjustment section 108.

Second Embodiment

Figure 5:
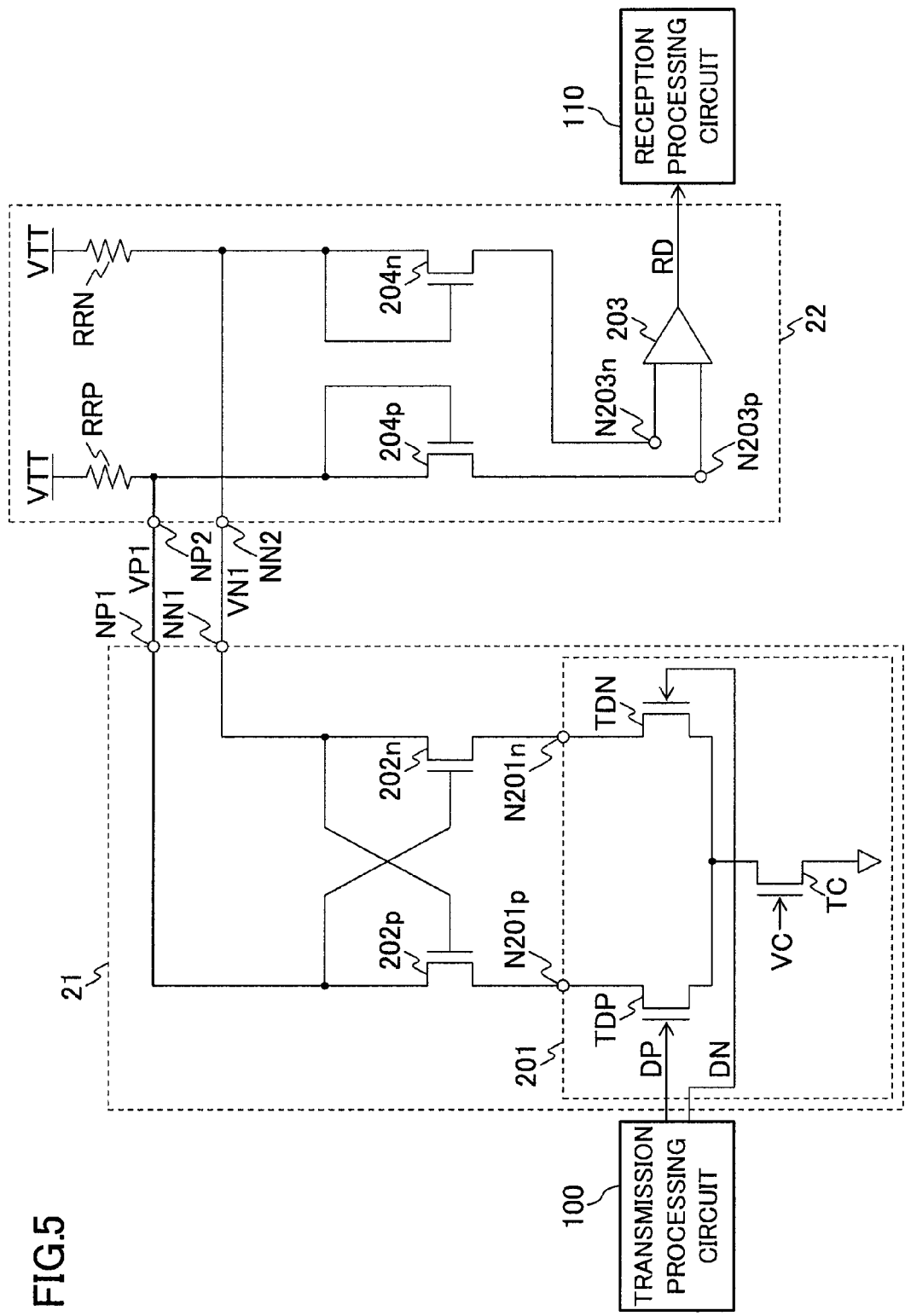
FIG. 5 is a view showing a configuration of a transmission/reception system of the second embodiment.

FIG. 5 shows a configuration of a transmission/reception system of the second embodiment. This transmission/reception system includes: a transmission apparatus including a transmission processing circuit 100 and a data communication circuit 21; and a reception apparatus including a data transmission circuit 22 and a reception processing circuit 110. The data communication circuit 21 includes a driver 201 and voltage-relaxing transistors 202p and 202n. The data communication circuit 22 includes a receiver 203, voltage-relaxing transistors 204p and 204n, and termination resistances RRP and RRN. A signal node NP1 of the data communication circuit 21 and a signal node NP2 of the data communication circuit 22 are connected to one signal line of a signal line pair, and a signal node NN1 of the data communication circuit 21 and a signal node NN2 of the data communication circuit 22 are connected to the other signal line of the signal line pair. The termination resistance RRP is connected between a power supply node receiving a terminal power supply voltage VTT and the signal node NP2, and the termination resistance RRN is connected between a power supply node receiving the terminal power supply voltage VTT and the signal node NN2.

The transmission processing circuit 100 supplies a transmission data pair DP and DN that change complementarily to each other. The driver 201 converts the transmission data pair DP and DN to a data signal pair and supplies the data signal pair via supply nodes N201p and N201n. The driver 201 includes drive transistors TDP and TDN and a current source transistor TC, for example. The drive transistors TDP and TDN are switched on/off complementarily according to the transmission data pair DP and DN. Assuming that the voltage drop at the termination resistances RRP and RRN is "Vα," for example, a signal voltage VP1 will be "VTT-Vα" and a signal voltage VN1 will be "VTT" when the level of the transmission data DP is high and the level of the transmission data DN is low. Conversely, when the level of the transmission data DP is low and the level of the transmission data DN is high, the signal voltage VP1 will be "VTT" and the signal voltage VN1 will be "VTT-Vα." The complementary transitions of the signal voltages VP1 and VN1 are conveyed to the receiver 203 via the voltage-relaxing transistors 204p and 204n. In this way, the receiver 203 receives the data signal pair (data signals changing complementarily to each other) transmitted from the data communication circuit 21 via input nodes N203p and N203n. The receiver 203 converts the data signal pair to reception data RD and supplies the data to the reception processing circuit 110.

The voltage-relaxing transistor 202p has a source connected to the supply node N201p of the driver 201, a drain connected to the signal node NP1, and a gate to which the voltage at the signal node NN1 (the signal voltage VN1) is applied. Likewise, the voltage-relaxing transistor 202n has a source connected to the supply node N201n of the driver 201, a drain connected to the signal node NN1, and a gate to which the voltage at the signal node NP1 (the signal voltage VP1) is applied.

The voltage-relaxing transistor 204p has a source connected to the input node N203p of the receiver 203, a drain connected to the signal node NP2, and a gate to which the voltage at the signal node NP2 (the signal voltage VP1) is applied. Likewise, the voltage-relaxing transistor 204n has a source connected to the input node N203n of the receiver 203, a drain connected to the signal node NN2, and a gate to which the voltage at the signal node NN2 (the signal voltage VN1) is applied. Since the voltages at the input nodes N203p and N203n can be relaxed by the voltage-relaxing transistors 204p and 204n, the receiver 203 can be prevented from breakdown. Moreover, since the inter-terminal voltages of the voltage-relaxing transistors 204p and 204n can be made lower than the signal voltages VP1 and VN1, the voltage-relaxing transistors 204p and 204n can also be prevented from breakdown.

(Voltage Relaxation)

Voltage relaxation by the voltage-relaxing transistors 202p and 202n shown in FIG. 5 will be described. Assume herein that the threshold voltage of the voltage-relaxing transistors 202p and 202n is "Vth" and the voltage drop at the termination resistances RRP and RRN is "Vα," for simplicity of description.

When the signal voltage VP1 is "VTT-Vα" and the signal voltage VN1 is "VTT," the voltage at the supply node N201p (the source voltage of the voltage-relaxing transistor 202p) is "VTT-Vth" and the voltage at the supply node N201n (the source voltage of the voltage-relaxing transistor 202n) is "VTT-Vα-Vth." Also, with the drain and gate voltages of the voltage-relaxing transistor 202p being "VTT-Vα" and "VTT," respectively, the inter-terminal voltages of the voltage-relaxing transistor 202p can be made lower than "VTT." Likewise, with the drain and gate voltages of the voltage-relaxing transistor 202n being "VTT" and "VTT-Vα," respectively, the inter-terminal voltages of the voltage-relaxing transistor 202n can be made lower than "VTT." This also applies when the signal voltage VP1 is "VTT" and the signal voltage VN1 is "VTT-Vα."

When both of the transmission data pair DP and DN are low (when the data transmission circuit 21 is powered off, for example), both the signal voltages VP1 and VN1 are "VTT." In this case, the voltages at the supply nodes N201p and N201n (the source voltages of the voltage-relaxing transistors 202p and 202n) are "VTT-Vth." Also, with the drain and gate voltages of the voltage-relaxing transistors 202p and 202n being "VTT," the inter-terminal voltages of the voltage-relaxing transistors 202p and 202n can be made lower than "VTT."

As described above, since the voltages at the supply nodes N201p and N201n can be relaxed by the voltage-relaxing transistors 202p and 202n, the driver 201 can be prevented from breakdown. Moreover, since the inter-terminal voltages of the voltage-relaxing transistors 202p and 202n can be made lower than the signal voltages VP1 and VN1, the voltage-relaxing transistors 202p and 202n can also be prevented from breakdown.

In addition, since the conductances of the voltage-relaxing transistors 202p and 202n can be changed complementarily to each other according to the complementary transitions of the signal voltages VP1 and VN1, degradation in the transition speed of the signal voltages VP1 and VN1 can be reduced. For example, when the signal voltage VP1 drops from "VTT" to "VTT-Vα" while the signal voltage VN1 rises from "VTT-Vα" to "VTT," the conductance of the voltage-relaxing transistor 202p increases with the rise of the signal voltage VN1, thereby increasing the dropping speed of the signal voltage VP1.

(Threshold Voltage of Voltage-Relaxing Transistor)

It is preferred that the threshold voltage of the voltage-relaxing transistor 202p is equal to or more than the maximum voltage difference between the breakdown voltage of an element connected to the source of the voltage-relaxing transistor 202p and the gate voltage of the voltage-relaxing transistor 202p. For example, in the configuration of FIG. 5, when the breakdown voltage of the driver 201 is "2.5 V" and the termination power supply voltage VTT is "3.3 V," it is preferred that the threshold voltage of the voltage-relaxing transistor 202p is "0.8 V" or more. By this setting, the element connected to the source of the voltage-relaxing transistor 202p (the driver 201 in FIG. 5) can be prevented from breakdown. This also applies to the threshold voltages of the voltage-relaxing transistors 202n, 204p, and 204n.

First Variation of Second Embodiment

Figure 6:
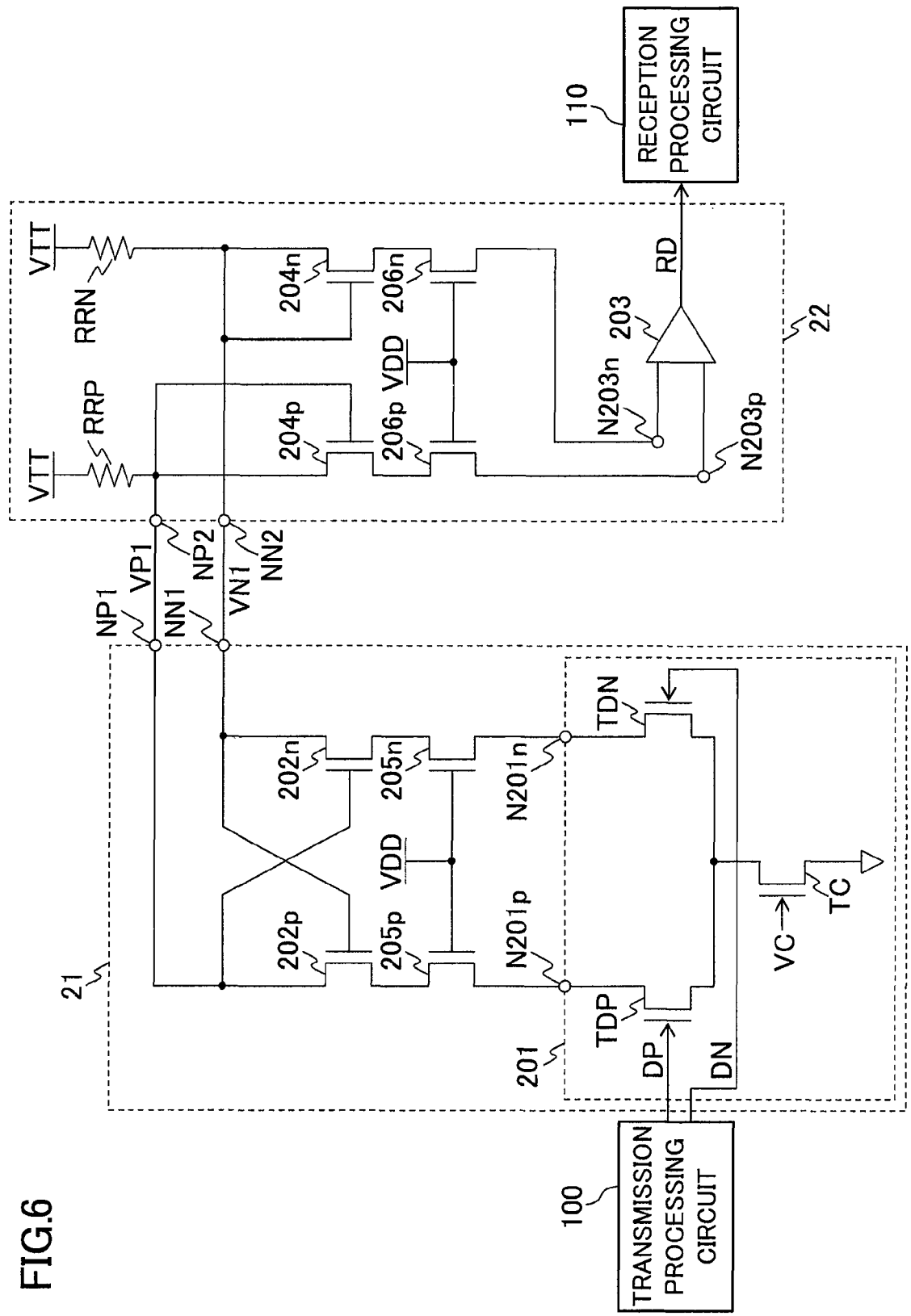
FIG. 6 is a view illustrating the first variation of the transmission/reception system of FIG. 5.

As shown in FIG. 6, the data communication circuit 21 may be further provided with auxiliary transistors 205p and 205n. The auxiliary transistors 205p and 205n are respectively interposed between the supply nodes N201p and N201n of the driver 201 and the sources of the voltage-relaxing transistors 202p and 202n. A predetermined bias voltage (the power supply voltage VDD in the illustrated example) is applied to the gates of the auxiliary transistors 205p and 205n. With this configuration, a limit can be placed on the voltages at the supply nodes N201p and N201n not to exceed the gate voltages of the auxiliary transistors 205p and 205n, respectively. Also, with the voltage relaxing effect of the voltage-relaxing transistors 202p and 202n, the auxiliary transistors 205p and 205n can be prevented from breakdown.

Likewise, the data communication circuit 22 may be further provided with auxiliary transistors 206p and 206n. The auxiliary transistors 206p and 206n are respectively interposed between the input nodes N203p and N203n of the receiver 203 and the sources of the voltage-relaxing transistors 204p and 204n. A predetermined bias voltage (the power supply voltage VDD in the illustrated example) is applied to the gates of the auxiliary transistors 206p and 206n.

Second Variation of Second Embodiment

Figure 7:
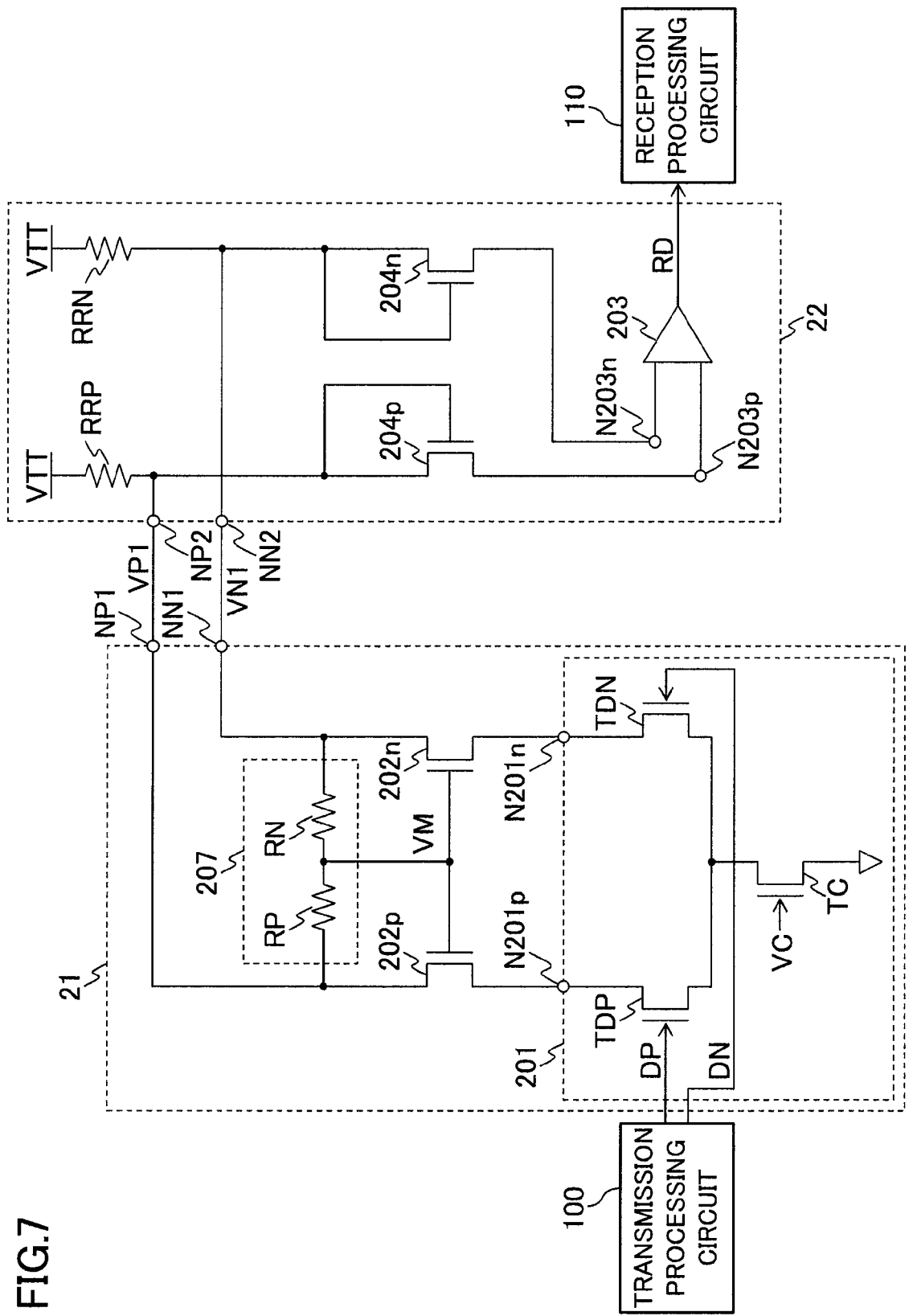
FIG. 7 is a view illustrating the second variation of the transmission/reception system of FIG. 5.

As shown in FIG. 7, the data communication circuit 21 may be further provided with a voltage adjustment section 207. The voltage adjustment section 207, interposed between the drains and gates of the voltage-relaxing transistors 202p and 202n, supplies a control voltage VM corresponding to the intermediate voltage between the voltages at the signal nodes NP1 and NN1 (the signal voltages VP1 and VN1) to the gates of the voltage-relaxing transistors 202p and 202n. The voltage adjustment section 207 is constructed of resistances RP and RN connected in series between the signal nodes NP1 and NN1, for example. With this configuration, since the source voltages of the voltage-relaxing transistors 202p and 202n can be made lower than those in the case of applying the signal voltages VP1 and VN1 to the gates of the voltage-relaxing transistors 202p and 202n, the voltage relaxing effect of the voltage-relaxing transistors 202p and 202n can be improved.

Figure 8A:
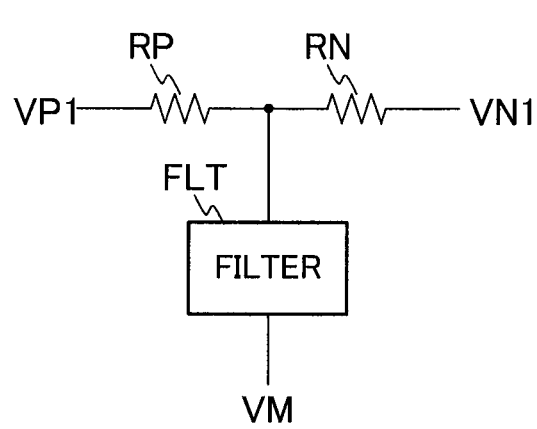
FIG. 8 is a view illustrating variations of a voltage adjustment section shown in FIG. 7.
Figure 8B:
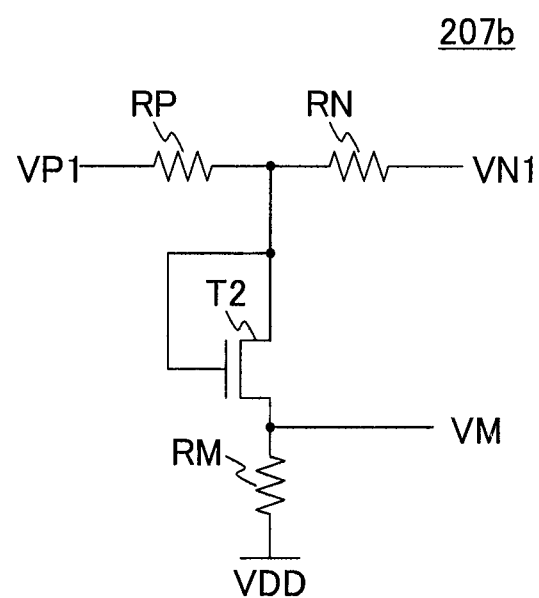

The data communication circuit 21 shown in FIG. 7 may be further provided with the auxiliary transistors 205p and 205n shown in FIG. 6. Also, the data communication circuit 21 shown in FIG. 7 may be provided with a voltage adjustment section 207a shown in FIG. 8A or a voltage adjustment section 207b shown in FIG. 8B, in place of the voltage adjustment section 207. The voltage adjustment section 207a shown in FIG. 8A includes the resistances RP and RN and a filter FLT that smoothes the intermediate voltage generated at a connection node of the resistances RP and RN and outputs the resultant voltage as the control voltage VM. With this configuration, the voltage value of the control voltage VM can be stabilized. The voltage adjustment section 207b shown in FIG. 8B includes the resistances RP and RN, an nMOS transistor T2, and a resistance RM connected in series between the connection node of the resistances RP and RN and a power supply node receiving the power supply voltage VDD. With this configuration, since the control voltage VM can be adjusted, arbitrary setting of the voltage relaxing effect of the voltage-relaxing transistors 202p and 202n is permitted.

Third Embodiment

Figure 9:
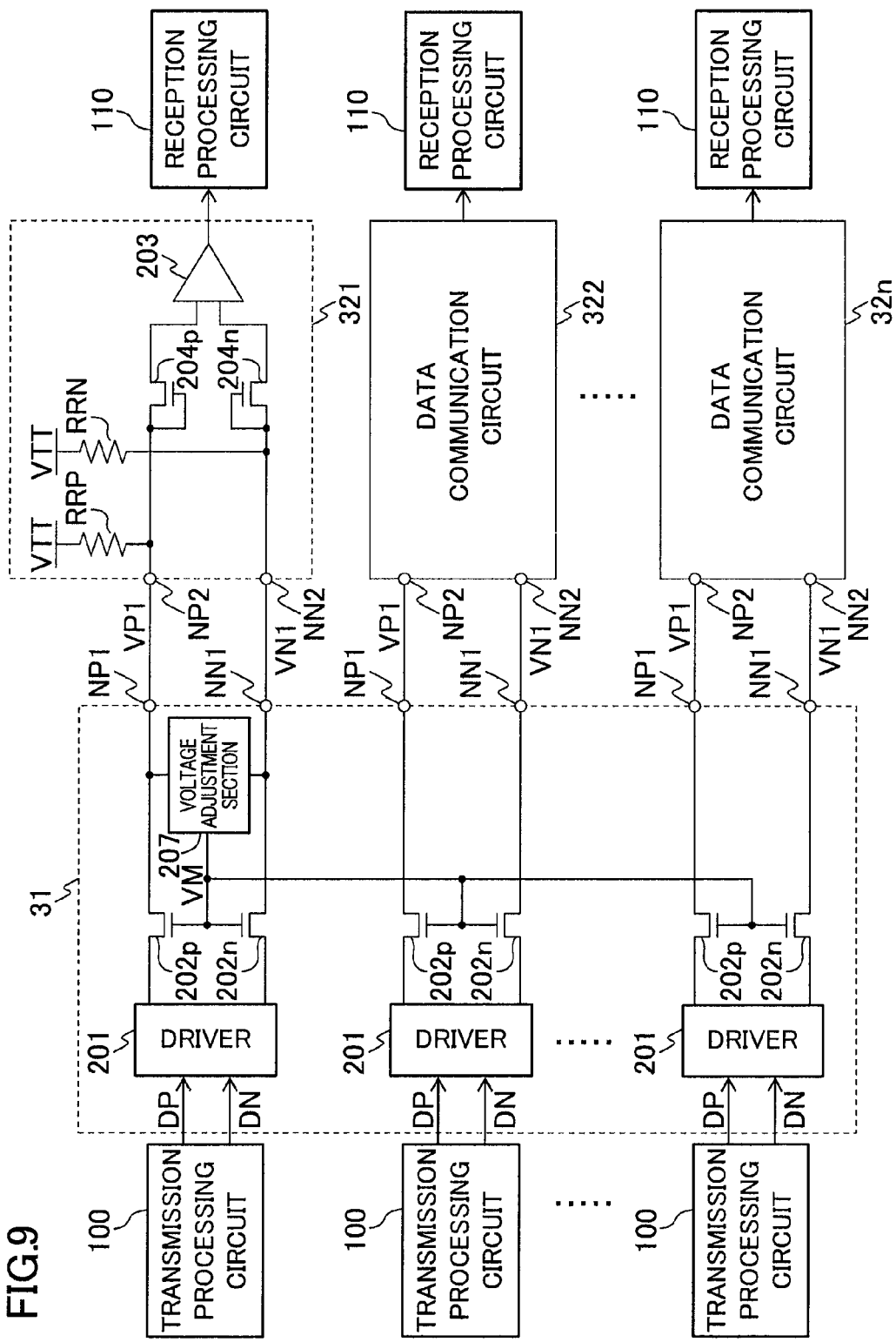
FIG. 9 is a view showing a configuration of a transmission/reception system of the third embodiment.

FIG. 9 shows a configuration of a transmission/reception system of the third embodiment. This transmission/reception system includes: a transmission apparatus including n transmission processing circuits 100, 100, . . . and a data communication circuit 31; and n reception apparatuses. The n reception apparatuses respectively include data communication circuits 321, 322, . . . , 32n and reception processing circuits 110, 110, . . . . N signal node pairs (each made of signal nodes NP1 and NN1) of the data communication circuit 31 are respectively connected to n signal line pairs. The data communication circuits 321, 322, . . . , 32n respectively correspond to the n signal line pairs, with signal nodes NP2 and NN2 of the data communication circuits being connected to the corresponding signal line pairs.

The data communication circuit 31 includes n drivers 201, 201, . . . , n voltage-relaxing transistors 202p, 202p, . . . , n voltage-relaxing transistors 202n, 202n, . . . , and a voltage adjustment section 207. The data communication circuits 321, 322, . . . , 32n have the same configuration as the data communication circuit 22 shown in FIG. 5. In the data communication circuit 31, the drivers 201, the voltage-relaxing transistors 202p and 202n, and the signal nodes NP1 and NN1 have the same connection as that shown in FIG. 5. The voltage adjustment section 207 corresponds to any one of the plurality of signal line pairs, and supplies, as the control voltage VM, the intermediate voltage between the voltages at the signal nodes NP1 and NN1 (the signal voltages VP1 and VN1) connected to the corresponding signal line pair to the gates of the voltage-relaxing transistors 202p, 202p, . . . and the voltage-relaxing transistors 202n, 202n, . . . .

As described above, by sharing the voltage adjustment section 207, variations in the response speed of the voltage-relaxing transistors 202p and 202n caused by characteristic variations of the voltage adjustment section 207 can be reduced, compared with the case of providing the voltage adjustment section 207 individually for each signal line pair.

The data communication circuit 31 may be further provided with n auxiliary transistors 205p, 205p, . . . and n auxiliary transistors 205n, 205n, . . . corresponding to the n drivers 201, 201, . . . . Likewise, each of the data communication circuits 321, 322, . . . , 32n may be further provided with the auxiliary transistors 206p and 206n shown in FIG. 6. Also, the data communication circuit 31 may be provided with the voltage adjustment section 207a shown in FIG. 8A or the voltage adjustment section 207b shown in FIG. 8B, in place of the voltage adjustment section 207.

When n data signal pairs transferred to the n signal line pairs have different frequencies from each other, it is preferred to connect the voltage adjustment section 207 to a signal line pair that conveys a data signal pair having the lowest frequency, among the n signal line pairs. This is because ripple is less likely to occur when the voltage adjustment section 207 is connected to a signal line pair to which a data signal pair having a lower frequency is transferred. For example, when the data communication circuit 31 is to transmit one clock signal and four data signals according to the low voltage differential signal (LVDS) standards, it is preferred to connect the voltage adjustment section 207 to a signal line pair to which the clock signal is transferred because the frequency of the clock signal is lower than the frequency of the data signals.

As described above, the data communication circuits described above, in which the voltage-relaxing transistors can be prevented from breakdown, are suitable for use in transmission apparatuses and reception apparatuses.

It should be noted that the embodiments described above are essentially preferred illustrations, and by no means intended to restrict the scope of the present invention, applications thereof, or uses thereof.

What is claimed is:

1. A data communication circuit configured to transmit a data signal pair including first and second data signals changing complementarily to each other via a signal line pair, the circuit comprising:
a driver configured to supply the data signal pair via a supply node pair including first and second supply nodes;
a first voltage-relaxing transistor having a source connected to the first supply node of the driver, a drain connected to a first signal node connected to one signal line of the signal line pair, and a gate to which a voltage at a second signal node connected to the other signal line of the signal line pair is applied; and
a second voltage-relaxing transistor having a source connected to the second supply node of the driver, a drain connected to the second signal node, and a gate to which a voltage at the first signal node is applied.

2. The data communication circuit of claim 1, further comprising:
a first auxiliary transistor interposed between the first supply node of the driver and the source of the first voltage-relaxing transistor, the first auxiliary transistor having a source connected to the first supply node of the driver, a drain connected to the source of the first voltage-relaxing transistor, and a gate to which a first bias voltage is applied; and
a second auxiliary transistor interposed between the second supply node of the driver and the source of the second voltage-relaxing transistor, the second auxiliary transistor having a source connected to the second supply node of the driver, a drain connected to the source of the second voltage-relaxing transistor, and a gate to which a second bias voltage is applied.

3. The data communication circuit of claim 1, further comprising:
a voltage adjustment section interposed between the drains and gates of the first and second voltage-relaxing transistors, the voltage adjustment section supplying a control voltage corresponding to an intermediate voltage between voltages at the first and second signal nodes to the gates of the first and second voltage-relaxing transistors.

4. The data communication circuit of claim 1, wherein a threshold voltage of the first voltage-relaxing transistor is equal to or more than a maximum voltage difference between a breakdown voltage of an element connected to the source of the first voltage-relaxing transistor and a gate voltage of the first voltage-relaxing transistor, and a threshold voltage of the second voltage-relaxing transistor is equal to or more than a maximum voltage difference between a breakdown voltage of an element connected to the source of the second voltage-relaxing transistor and a gate voltage of the second voltage-relaxing transistor.

5. A transmission apparatus, comprising:
the data communication circuit of claim 1; and
a transmission processing circuit configured to supply transmission data to the driver,
wherein the driver converts the transmission data to the data signal pair.

6. A transmission/reception system, comprising:
the transmission apparatus of claim 5; and
a reception apparatus configured to receive the data signal pair via the signal line pair.

7. A data communication circuit configured to transmit a plurality of data signal pairs, each including first and second data signals changing complementarily to each other, via a plurality of signal line pairs, the circuit comprising:
a plurality of drivers each configured to supply the data signal pair via a supply node pair including first and second supply nodes;
a plurality of first voltage-relaxing transistors corresponding to the plurality of signal line pairs and the plurality of drivers, each of the first voltage-relaxing transistors having a source connected to the first supply node of the corresponding driver and a drain connected to a first signal node connected to one signal line of the corresponding signal line pair;
a plurality of second voltage-relaxing transistors corresponding to the plurality of signal line pairs and the plurality of drivers, each of the second voltage-relaxing transistors having a source connected to the second supply node of the corresponding driver and a drain connected to a second signal node connected to the other signal line of the corresponding signal line pair; and
a voltage adjustment section configured to supply a control voltage corresponding to an intermediate voltage between voltages at the first and second signal nodes connected to any one signal line pair out of the plurality of signal line pairs to gates of the plurality of first voltage-relaxing transistors and the plurality of second voltage-relaxing transistors.

8. A transmission apparatus, comprising:
the data communication circuit of claim 7; and
a plurality of transmission processing circuits corresponding to the plurality of drivers, each of the transmission processing circuits supplying transmission data to the corresponding driver,
wherein each of the plurality of drivers converts the transmission data to the data signal pair.

9. A transmission/reception system, comprising:
the transmission apparatus of claim 8; and
a plurality of reception apparatuses corresponding to the plurality of signal line pairs, each of the reception apparatuses receiving the data signal pair via the corresponding signal line pair.

10. A data transmission circuit configured to transmit a data signal via a signal line to an data reception circuit including a receiver configured to receive the data signal via an input node, a first voltage-relaxing transistor having a source connected to the input node of the receiver, a drain connected to a first signal node connected to the signal line, and a gate to which a voltage at the first signal node is applied, and a termination resistance connected to the first signal node, said data transmission circuit comprising:
a driver configured to supply the data signal via a supply node; and
a second voltage-relaxing transistor having a source connected to the supply node of the driver, a drain connected to a second signal node connected to the signal line, and a gate to which a voltage at the second signal node is applied.

11. A data communication circuit configured to transmit a data signal via a signal line, comprising:

a driver configured to supply the data signal via a supply node;

a voltage-relaxing transistor having a source connected to the supply node of the driver, a drain connected to a signal node connected to the signal line, and a gate to which a voltage at the signal node is applied; and an auxiliary transistor interposed between the supply node of the driver and the source of the voltage-relaxing transistor, the auxiliary transistor having a source connected to the supply node of the driver, a drain connected to the source of the voltage-relaxing transistor, and a gate to which a bias voltage is applied.

12. A data communication circuit configured to transmit a data signal via a signal line, comprising:

a driver configured to supply the data signal via a supply node;

a voltage-relaxing transistor having a source connected to the supply node of the driver, a drain connected to a signal node connected to the signal line, and a gate to which a voltage at the signal node is applied; and a voltage adjustment section interposed between the drain and gate of the voltage-relaxing transistor, the voltage adjustment section generating a control voltage based on a voltage at the signal node and supplying the control voltage to the gate of the voltage-relaxing transistor.

13. A data communication circuit configured to transmit a data signal via a signal line, comprising:

a driver configured to supply the data signal via a supply node; and a voltage-relaxing transistor having a source connected to the supply node of the driver, a drain connected to a signal node connected to the signal line, and a gate to which a voltage at the signal node is applied;

wherein a threshold voltage of the voltage-relaxing transistor is equal to or more than a maximum voltage difference between a breakdown voltage of an element connected to the source of the voltage-relaxing transistor and a gate voltage of the voltage-relaxing transistor.

14. A transmission apparatus, comprising:

the data transmission circuit of claim 10; and a transmission processing circuit configured to supply transmission data to the driver, wherein the driver converts the transmission data to the data signal.

15. A transmission/reception system, comprising:

the transmission apparatus of claim 14; and a reception apparatus configured to receive the data signal via the signal line.

16. A reception apparatus, comprising:

a data reception circuit configured to receive a data signal via a signal line from a data transmission circuit; and a reception processing circuit, wherein the data reception circuit includes, a receiver configured to receive the data signal via an input node, a first voltage-relaxing transistor having a source connected to the input node of the receiver, a drain connected to a first signal node connected to the signal line, and a gate to which a voltage at the first signal node is applied, and a termination resistance connected to the first signal node, the data transmission circuit includes, a driver configured to supply the data signal via a supply node; and a second voltage-relaxing transistor having a source connected to the supply node of the driver, a drain connected to a second signal node connected to the signal line, and a gate to which a voltage at the second signal node is applied, the receiver converts the data signal to reception data and supplies the reception data to the reception processing circuit.

* * * * *